United States Patent
Meyer et al.

(10) Patent No.: US 8,687,822 B1
(45) Date of Patent: Apr. 1, 2014

(54) FILTERING SYSTEM FOR EQUALIZING A LOUDSPEAKER SYSTEM

(75) Inventors: Perrin Meyer, Albany, CA (US); Pablo Espinosa, Pleasanton, CA (US); John Meyer, Berkeley, CA (US); Paul Kohut, Napa, CA (US)

(73) Assignee: Meyer Sound Laboratories, Incorporated, Berkeley, CA (US)

( * ) Notice: Subject to any disclaimer, the term of this patent is extended or adjusted under 35 U.S.C. 154(b) by 1743 days.

(21) Appl. No.: 11/332,504

(22) Filed: Jan. 12, 2006

Related U.S. Application Data

(60) Provisional application No. 60/643,667, filed on Jan. 12, 2005.

(51) Int. Cl.
  *H03G 5/00* (2006.01)
(52) U.S. Cl.
  USPC .................. 381/103; 381/98; 333/28 R
(58) Field of Classification Search
  USPC .............. 381/66, 97–103, 58–59, 61, 381/71.1–71.14, 94.1–94.9; 700/94; 333/28 R
  See application file for complete search history.

(56) References Cited

U.S. PATENT DOCUMENTS

| | | | | |
|---|---|---|---|---|
| 3,906,157 A | * | 9/1975 | Boner et al. | 381/66 |
| 3,924,199 A | * | 12/1975 | Pearlman | 330/107 |
| 4,137,510 A | * | 1/1979 | Iwahara | 333/132 |
| 4,641,361 A | * | 2/1987 | Rosback | 381/103 |
| 5,617,480 A | * | 4/1997 | Ballard et al. | 381/98 |
| 7,184,556 B1 | * | 2/2007 | Johnson et al. | 381/61 |
| 2006/0098827 A1 | * | 5/2006 | Paddock et al. | 381/106 |

* cited by examiner

*Primary Examiner* — Xu Mei
(74) *Attorney, Agent, or Firm* — Beeson Skinner Beverly, LLP

(57) ABSTRACT

An improved filtering system for loudspeaker equalization is comprised of two filtering sections, a single pole filtering section having single pole filters for shaping the frequency response of the audio signal over the operative bandwidth of the equalized loudspeaker system, and a parametric filtering section that provides for localized parametric equalization for compensating for room or other environmental resonances. The filtering system of the invention can be used to create a wide variety of useful filter shapes, while minimizing phase distortion that can harm the transient response of phase-aligned loudspeakers of a loudspeaker system.

21 Claims, 5 Drawing Sheets

FILTERING SYSTEM FOR EQUALIZING A LOUDSPEAKER SYSTEM

CROSS-REFERENCE TO RELATED APPLICATIONS

This application claims the benefit of U.S. provisional application Ser. No. 60/643,667, filed Jan. 12, 2005, which is incorporated herein by reference.

BACKGROUND OF THE INVENTION

The present invention generally relates to filters used in audio applications and more particularly to filters designed to allow for accurate loudspeaker system equalization.

There are two standard equalization devices used for loudspeaker equalization. "Graphic" equalization devices are used to alter the tonal balance of program material (music, speech). Traditionally, these devices are comprised of a large number of second-order filters, and particularly octave band or one third octave band banks of fixed filters. Since the location of the center frequency of each filter is fixed, the frequency bands often do not correspond to the necessary bands for loudspeaker system equalization. Also, these fixed filters can interact poorly, creating phase distortion when adjacent bands are set incorrectly.

Banks of parametric filters are also used for loudspeaker equalization. Parametric filters are not fixed, however, in isolation, neither parametric nor graphic equalizers can create the filter shapes necessary for advanced loudspeaker equalization and setup.

The present invention provides a filtering system and method for equalizing loudspeaker systems that improves on the ability to create a wide variety of filter shapes to address a wide variety of equalization needs and challenges. The present invention provides a filtering system and method that minimizes the phase distortion associated with high order filters, while providing the filter shapes necessary to equalize arrays of flat frequency response loudspeakers in resonant acoustic environments.

SUMMARY OF INVENTION

In one aspect, the present invention involves a filtering system for loudspeaker equalization comprised of two filtering sections, a first single pole filtering section having single pole filters for shaping the frequency response of the audio signal over the operative bandwidth of the loudspeaker, and a second parametric filtering section that provides localized parametric equalization. While sometimes referred to herein as "first" and "second" filtering sections, it is understood that the order of filtering is not essential to the invention. What is essential is that the two filtering functions work in conjunction with each other to provide overall shaping of the audio input signal and localized second order corrections such as for room or other environmental resonances.

The first filtering section of the invention is comprised of at least two single pole filters and suitably three or more single pole filters for dividing the audio input signal into controllable frequency bands for shaping of the frequency response characteristics of the audio feed to the loudspeaker system. The single pole filters are most suitably cascaded low-pass filters, with the inverted output of one single pole filter being summed with its input and fed to the next single pole filter. Preferably, a gain stage is provided in association with at least one, and still more preferably with each of the frequency bands produced by the single pole filters in order to provide separate gain control for these bands. Additional control parameters for the first filter section include the break frequencies (sometimes referred to herein as "corner frequencies") of the single pole filters, which allow the bandwidth of the control bands to be adjusted to fit different acoustic materials with different sonic characteristics.

The second parametric filtering section of the invention has at least one, and suitably multiple in-series parametric filters that can be enabled for particular applications. The parametric filters are most suitably second order filters having three control parameters, namely, gain, center frequency, and bandwidth. The parametric filters are selectively used for local correction only and not for shaping of the frequency response. Generally, it is contemplated that the parametric filters will have a bandwidth falling in a range of about 0.1 octave to two octaves, and more suitably between about 0.1 octave and one octave.

In another aspect of the invention, a method is provided for equalizing a loudspeaker system. The method is comprised of the step of filtering an audio input signal to be fed to a loudspeaker system through at least two cascaded single pole filters for dividing the audio input signal into controllable frequency bands for overall shaping of the frequency response of the audio signal. As a further step of the method, the audio input signal is filtered through parametric filters for providing narrow, localized parametric equalization of the audio input signal in conjunction with the overall shaping provided by the single pole filters. The steps of the method can be performed in any order, however, in the preferred method of the invention it is contemplated that the overall shaping of the audio input signal using single pole filters will precede localized correction using parametric filters. While the parametric filters are higher order filters, there limited use for localized correction, such as correcting for room resonances and the like, will minimize phase anomalies associated with such higher order filters. Unlike conventional parametric equalizers, the parametric filters of the invention are not used for the purpose of shaping frequency response.

Therefore, it is a primary object of the present invention to provide a filtering system and method for equalizing loudspeaker systems that provides overall shaping, including the ability to tilt, frequency response as well as providing for localized correction for second order acoustic phenomena such as room resonances. Other objects of the invention will be apparent from the following specification and claims.

DETAILED DESCRIPTION OF THE ILLUSTRATED EMBODIMENT

Figure 1:
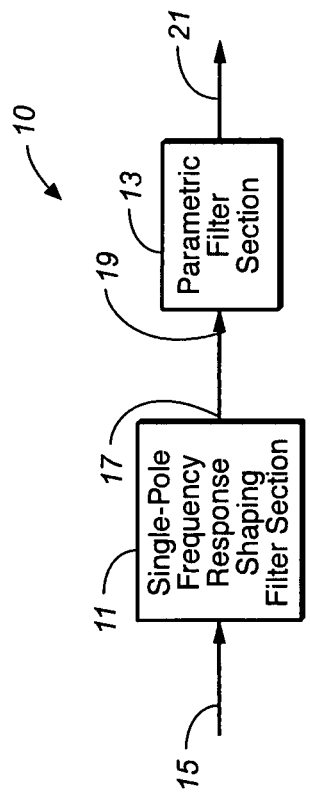
FIG. 1 is a block diagram graphically illustrating the two filter sections of the improved filtering system of the invention.

The present invention involves an improved filtering system, generally denoted in the drawings by the numeral 10, comprised of two operative sections. As best illustrated in FIG. 1, these operative sections include a first single pole frequency response shaping filter section 11 having an audio signal input 15, and a second higher order parametric filter section 13. The output 17 of the first single pole section is connected to the input 19 of the second section, and the output 21 of the second parametric filter section provides the output of the filtering system. In combination these filter sections can be employed to create a wide variety of useful filter shapes, while minimizing phase distortion that can harm the transient response of phase-aligned loudspeakers.

Figure 2:
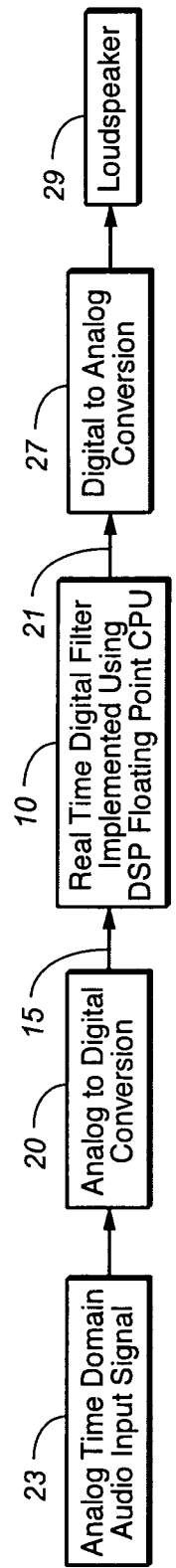
FIG. 2 is a block diagram graphically illustrating a digital implementation of the improved filtering system of the invention.

As above-mentioned, it will be understood that while the filtering sections are described herein for illustration purposes as discrete filtering sections arranged in a convenient logical order, the ordering of the filtering sections is not a requirement of the invention. Also, as illustrated in FIG. 2, the improved filtering system of the invention is suitably implemented as a real time digital filtering system using a DSP floating point CPU. With a digital implementation, the analog time domain audio input signal 19 first goes through an analog-to-digital conversion as represented by block 20. The digitized signal is then sent to the digital filtering system 10 as represented by the audio input signal arrow 15, and the filtered output 21 is then converted back to an analog signal, as represented by represented by block 27, for driving a loudspeaker 29.

Figure 3:
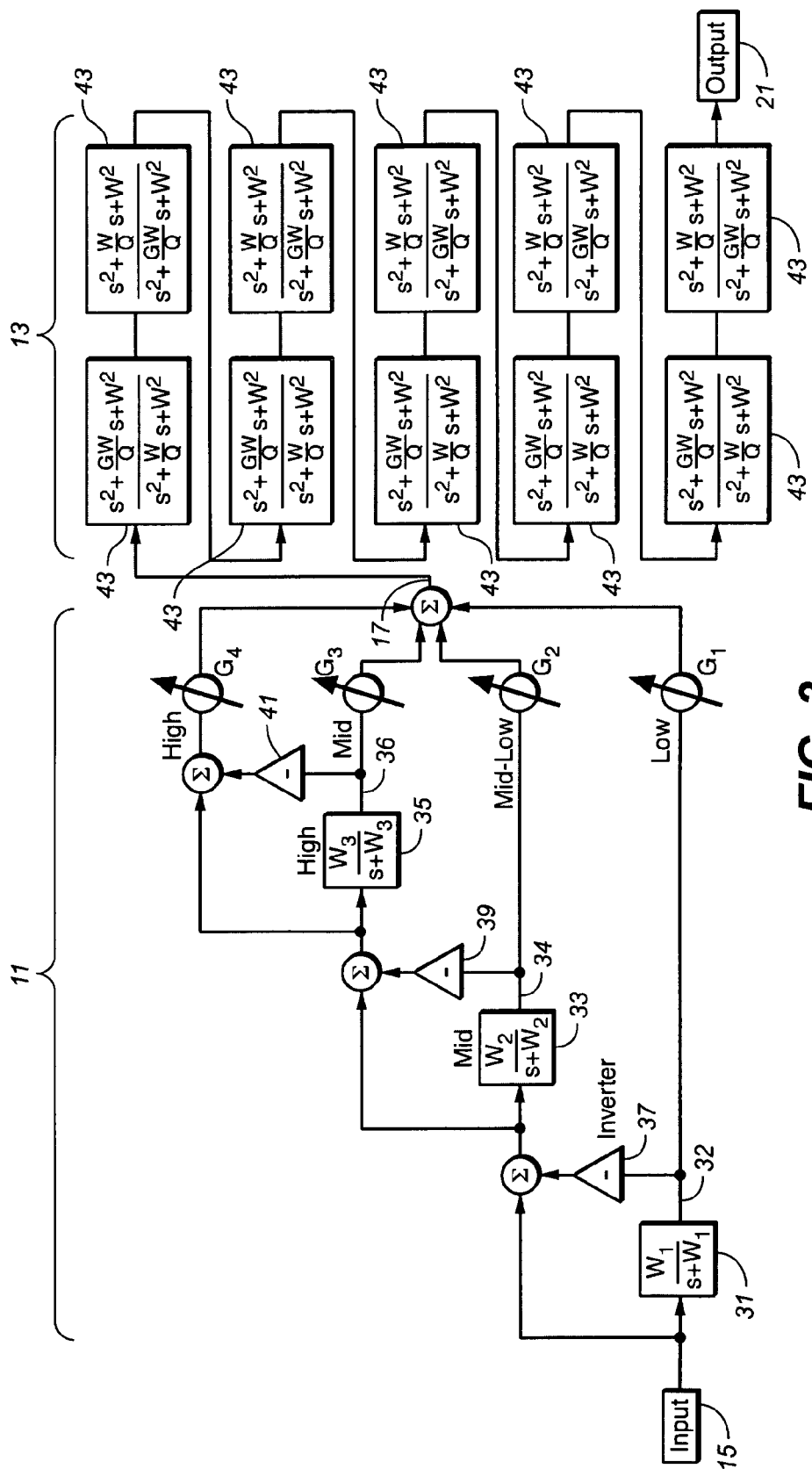
FIG. 3 is a frequency domain diagram of exemplary embodiments of the filter sections of the invention illustrated in FIG. 1.

FIG. 3 shows a frequency domain (Laplace transform) block diagram of a preferred embodiment of the filter sections illustrated in FIG. 1. The first section 11, sometimes referred to herein as the single pole and/or frequency response shaping filter section, is comprised of three cascaded single-pole low-pass filters 31, 33, 35 with outputs 32, 34, 36, associated invertors 37, 39, 41, 43, and four variable gain stages G1, G2, G3, and G4. The outputs 32, 34 of the first two filters 31, 33 are inverted by inverters 37 and 39 and then summed with the filter's input before being fed to the next filter. The outputs of these filters are also routed to gain stages G1, G2. The output 36 of the last filter 35 is routed to gain stages G3 and G4. Before being routed to gain stage G4 the output of this filter is also inverted and summed with its input. While in the illustrated embodiment, three single-pole low-pass filters and four gain stages are shown, it is shall be understood that the invention is not limited to a particular number of filters or gain stages within this first filter section.

With further reference to FIG. 3, it is seen that the illustrated first section of the filtering system has seven control parameters which can be varied. Three of the control parameters are provided by the single-pole low-pass filters, namely, corner frequencies W1, W2, and W3. The remaining control parameters are provided by the gains of the four gain stages G1, G2, G3, and G4. It is noted that these control parameters can be user adjustable parameters, or some or all of the control parameters can be preset in the designing of filtering systems for particular applications.

It can be seen that the output 17 from the frequency response shaping filter section 11 is the sum of the outputs of this section's four the gain stages G1, G2, G3, and G4. This output is directed to the next section of the filtering system, namely, the parametric filtering section 13. The parametric filtering section is comprised of a series of 2nd-order symmetric parametric boost or cut filters 43. FIG. 3 shows ten such filters, however, the number of filters in this section can vary. The desirable number of filters will depend on the application, including the particular loudspeaker system being equalized and the acoustical environment. Each of the 2nd order parametric filters has three control parameters, a gain G, a bandwidth Q, and a center frequency, W, where W(in radians per second)=$2\pi f$. It is contemplated that the bandwidth of these filters will be in a range of about 0.1 octave to two octaves, and normally between about 0.1 octave and one octave. A bandwidth of greater than two octaves would increase the likelihood of interaction between filters and the introduction of phase distortion.

As above-mentioned, the filters represented in FIG. 3 can be implemented on a digital loudspeaker management system comprised of a computer system for implementing real time time-domain filters in the digital domain, commonly referred to as digital signal processing (DSP). Floating point DSP hardware and software algorithms for real time linear time domain filtering are well understood and supported in available technical literature.

As above mentioned, the filter sections of the invention are designed to minimize the phase distortion typically produced by loudspeaker system equalization, allowing phase-corrected loudspeakers to produce sonically accurate sound. By setting the control parameters of each section, it is possible to create a very low phase distortion frequency response shaping filter, in shapes that are often encountered in loudspeaker system designs. By setting the three break frequencies, $W_1$, $W_2$, $W_3$ in the filters 31, 33, and 35 of the first filter section 11, the audio band can be divided into a low frequency portion, a mid-low frequency portion, a mid frequency portion, and a high frequency portion. These break frequencies can be varied to create frequency control bands that match the sonic characteristics of different program material. For example, different bands would be used for equalizing operatic music than with jazz music. The parametric filters 43 of the second filter section 13 can then be used for local, narrow band correction. For example, resonances caused by a room will be 2nd-order minimum phase phenomena. Using the parametric filters of the parametric filtering section of the invention, it is possible to equalize a loudspeaker system to compensate for such resonances. Again, because the parametric filters of the parametric filter section are not used for the overall shaping of the frequency response, introduction of phase distortion by these filters is minimized.

It is noted that the single pole, frequency response shaping filtering section 11 of the invention has another use. When relatively small loudspeakers are configured together in large arrays, such as at large venues, each individual loudspeaker is often set "flat", i.e. the frequency response of the loudspeaker is equal for all frequencies. However, when arrays of flat response loudspeakers are arrayed together, the mutual coupling between the transducers will cause the combined response of multiple arrayed loudspeakers to be far from a flat frequency response. The mutual coupling effect varies with the size and number of the loudspeakers used, but often the combined response of the multiple loudspeakers is such that a portion of the frequency response is "tilted", i.e. it has a gentle (less than 6 dB per octave) slope. This is very hard to equalize with conventional filters, since even the lowest order filter has a 6 dB per octave slope. The single pole filtering section can advantageously be used to equalize such flat response loudspeaker arrays. The invention's composite frequency response shaping filter section 11 provides a cascading summing network that allows for slopes that are less than 6 dB per octave. Also, the variable break frequencies of the network allow for modifying the slope of the frequency response filter depending on the number of loudspeaker boxes used in an array.

Figure 4:
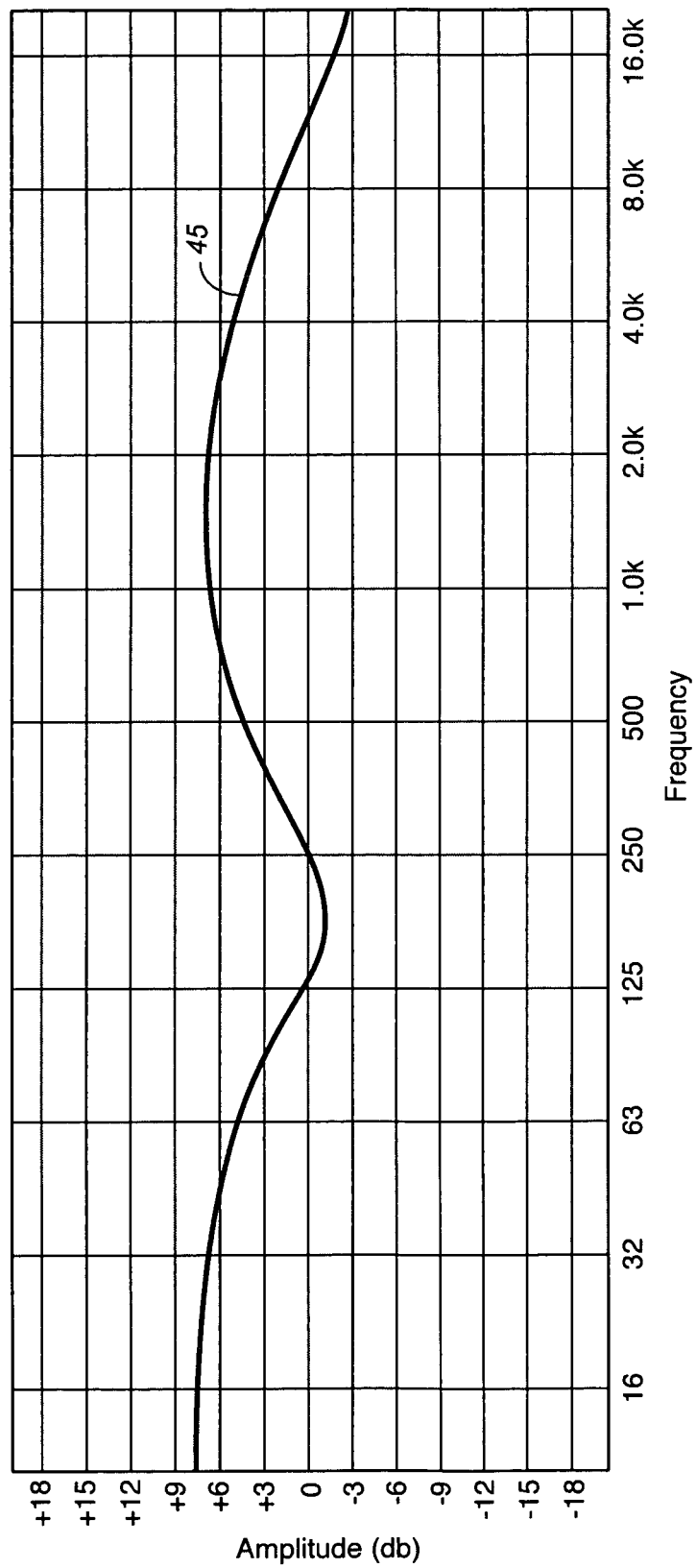
FIG. 4 is an amplitude vs. frequency graph showing an exemplary magnitude-frequency response of the single pole, frequency response shaping filter section of the invention.
Figure 5:
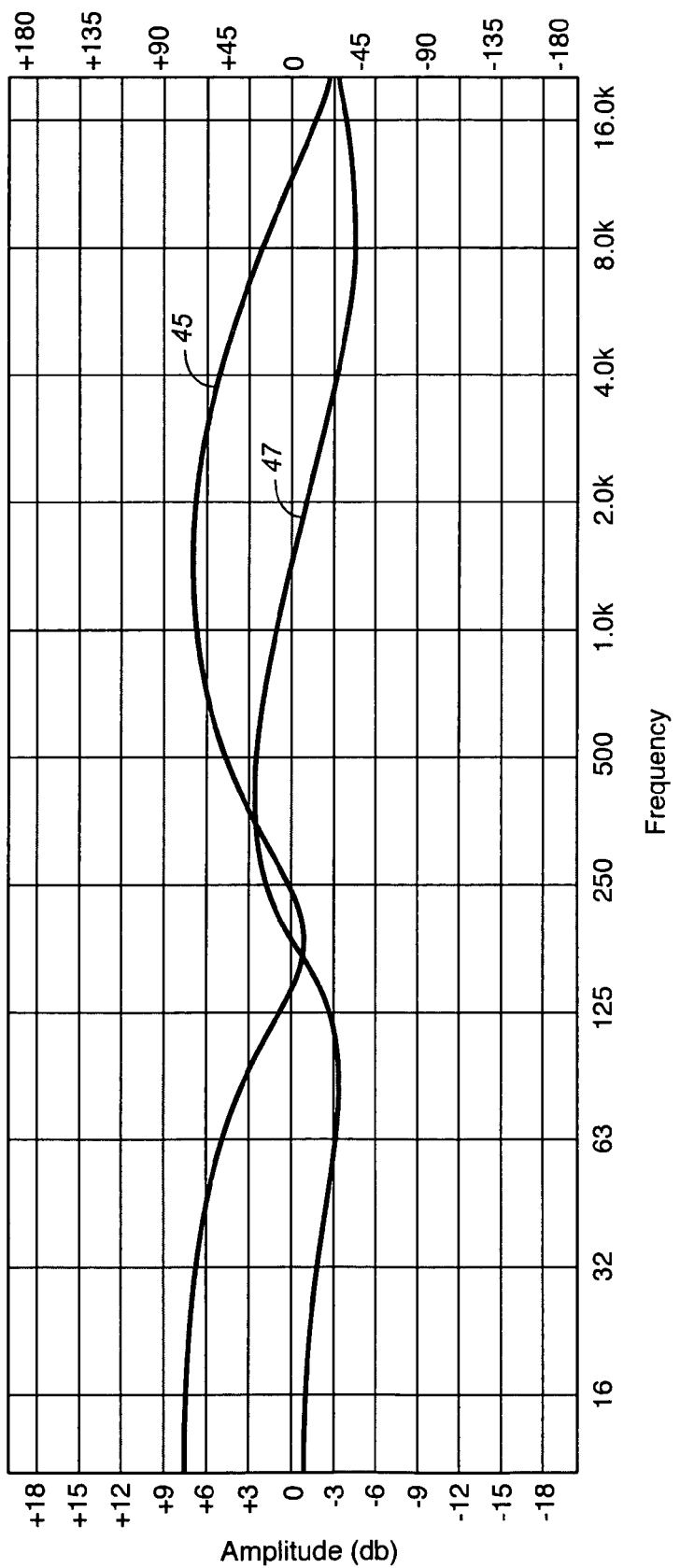
FIG. 5 is an amplitude vs. frequency graph showing the same exemplary magnitude frequency response shown in FIG. 4 with a phase plot (in degrees) of the frequency response shaping filter section superimposed on the magnitude plot.

FIG. 4 shows an exemplary magnitude vs. frequency response curve 45 of a frequency response shaping filter section in accordance with the invention. To achieve the response shown in FIG. 4, the control parameters for the filters 31, 33, 35 are set as follows: W1=2π 70 Hz, W2=2π 500 Hz, W3=2π 4 kHz. And the gains of the four gain stages are: G1=8 dB, G2=−3.5 dB, G3=8 dB, G4=−5 dB. FIG. 5 shows a phase plot 47 (in degrees) of the frequency response shaping filter section superimposed on the magnitude plot. The axis labels for the phase plot are on the right hand axis of the graph.

Figure 6:
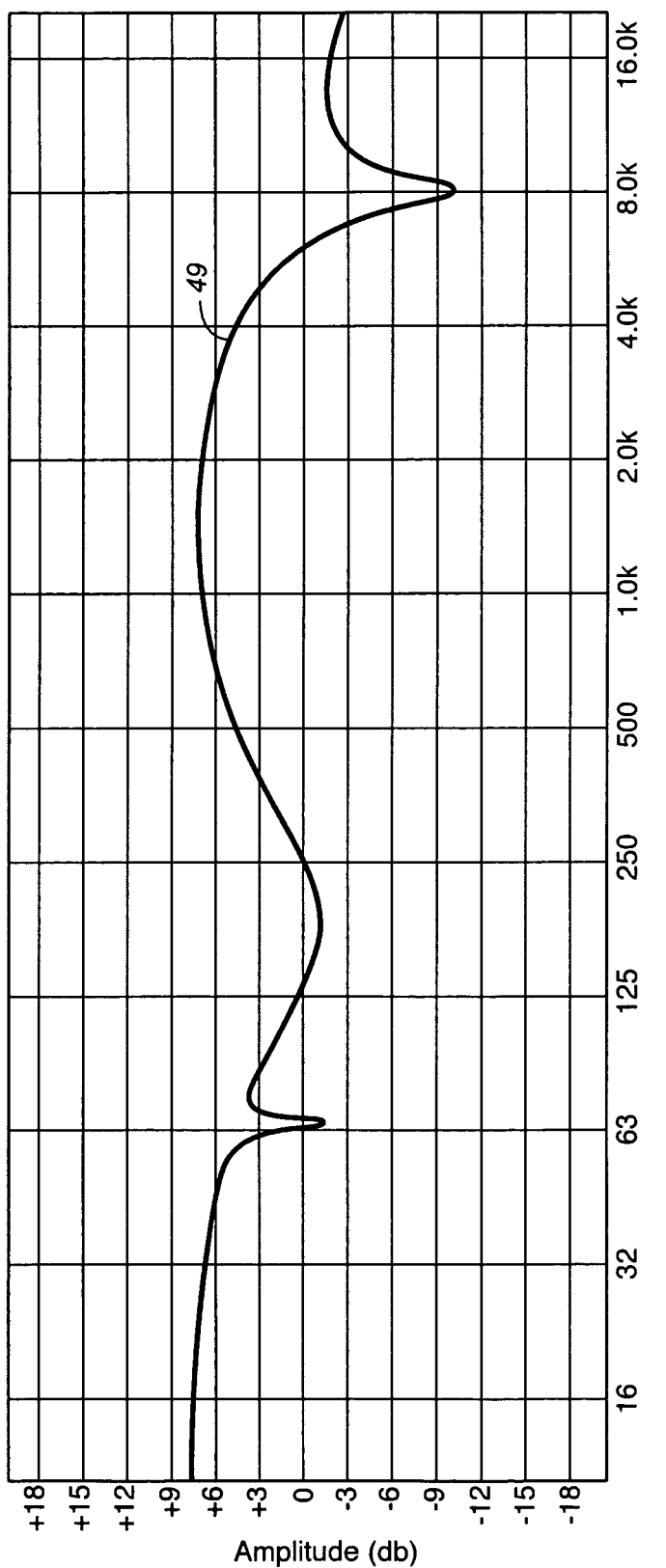
FIG. 6 shows the same graph as FIG. 5, but with two parametric filters of the parametric filter section of the invention enabled.

FIG. 6 shows the same plot as FIG. 5, but with two parametric filters of the parametric filter section of the invention engaged. The first parametric filter has a gain of −6.2 dB, a center frequency of 65 Hz, and a octave bandwidth of 0.1. The second parametric has a gain of −12 dB, a center frequency of 7.94 khz, and an octave bandwidth of 0.46. These two filter sections combine to form a composite curve 49 that allows for both broad, gentle sloped array equalization and narrow room resonance equalization correction.

Therefore, it can be seen the present invention provides a filtering system and method for equalizing loudspeaker systems that is capable of addressing a wide variety of equalization needs and challenges presented to an audio designer or engineer, and that can minimize phase anomalies associated with equalizers that rely on the use of a large number of higher order filters. The invention is particularly adapted, but not limited to providing the filter shapes necessary to equalize arrays of flat frequency response loudspeakers in resonant acoustic environments. While the invention has been described in considerable detail in the foregoing specification and the accompanying drawings, it is not intended that the invention be limited to such detail, except as necessitated by the following claims.

What we claim is:

1. A filtering system for equalizing a loudspeaker system including a loudspeaker driven by an audio input signal comprising:
an output for driving the loudspeaker,
a single pole filtering section having at least two minimum phase single pole filters having corner frequencies for dividing the audio input signal into controllable frequency bands and having a gain stage for each frequency band, said gain stages having gain stage outputs which are summed to provide a single output for said single pole filtering section, wherein overall shaping of the frequency response of the audio input signal is achieved by setting the corner frequencies of the single pole filters and the gain of the gain stages of said single pole filtering section, and
a parametric filtering section having at least one symmetric minimum phase second order parametric filter for providing correction for narrow band second order resonances, that exist in the environment of a particular application, said parametric filtering section being provided in conjunction with the overall shaping function of said single pole filtering section, wherein overall shaping of the frequency response of the audio input signal with correction for narrow band second order resonance is produced at the output of the filtering system with a composite complex frequency response having minimum phase.

2. The filtering system of claim 1 wherein the gain of the gain stage for each of the controllable frequency bands produced by said single pole filtering section is user adjustable.

3. The filtering system of claim 1 wherein each of the single pole filters of said single pole filtering section has an input and an output, and wherein said single pole filters are cascaded together with the output of one single pole filter being inverted and summed with its input for the input of the next single pole filter.

4. The filtering system of claim 1 wherein each of the single pole filters of said single pole filtering section are low-pass filters.

5. The filtering system of claim 1 wherein said parametric filter section includes at least two symmetric minimum phase second order in-series parametric filters.

6. The filtering system of claim 1 wherein said single pole filtering section includes at least three single pole filters for producing at least four controllable frequency bands, and a gain stage for each of said four frequency bands for controlling the gain of the audio input signal within each said frequency band.

7. The filtering system of claim 1 wherein the bandwidth of the at least one parametric filter of said parametric filtering section is no greater than about 1 octave.

8. A filtering system for equalizing a loudspeaker system including a loudspeaker driven by an audio input signal comprising:
a single pole filtering section having at least two cascaded, minimum phase, single pole, low-pass filters for dividing the audio input signal into at least two frequency bands, and a gain stage for each of the frequency bands produced by said single pole filtering section for providing gain control parameters for said frequency bands, said single pole filters being cascaded together with the output of one single pole filter being inverted and summed with its input for the input of the next single pole filter, and said single pole filters having controllable corner frequencies, said single pole filtering section having an output which is the sum of the outputs of the gain stages thereof; and
a parametric filtering section having symmetric minimum phase second order parametric filters, including at least two in-series symmetric minimum phase second order parametric filters, for providing correction for narrow band second order resonances, that exist in the environment of a particular application, said parametric filtering section being provided in conjunction with the overall shaping function of said shaping filtering section, wherein overall shaping of the frequency response of the audio input signal with correction for narrow band second order resonance is produced at the output of the filtering system with a composite complex frequency response having minimum phase.

9. The filtering system of claim 8 wherein said single pole filtering section includes at least three single pole, low-pass filters for producing at least four controllable frequency bands and a gain stage for each of said four frequency bands for controlling the gain of the audio input signal within each said frequency band.

10. The filtering system of claim 8 wherein said parametric filtering section follows said single pole filtering section.

11. The filtering system of claim 8 wherein said parametric filtering section has a plurality of selectable in-series symmetric minimum phase second order parametric filters.

12. The filtering system of claim 8 wherein at least one of said single pole and parametric filtering sections is implemented digitally using digital signal processing (DSP).

13. The filtering system of claim 8 wherein the filtering sections are implemented using at least one DSP floating point CPU.

14. The filtering system of claim 8 wherein the bandwidth of the each parametric filter of said parametric filtering section is no greater than about 1 octave.

15. A method of equalizing a loudspeaker system including a loudspeaker comprising in any order the steps of:

filtering an audio input signal through a single pole filtering section having at least two minimum phase cascaded single pole filters having corner frequencies for dividing the audio input signal into controllable frequency bands and having a gain stage for each frequency band, said gain stages having gain stage outputs which are summed to provide a single output for said single pole filtering section wherein overall shaping of the frequency response of the audio signal is achieved by setting the corner frequencies of the single pole filters and the gain of the gain stages of said single pole filtering section, and filtering the audio input signal through symmetric minimum phase second order parametric filters for providing correction for narrow band second order resonances, that exist in the environment of a particular application in conjunction with the overall shaping provided by the single pole filtering section.

16. The method of claim 15 further comprising separately setting the gain for the audio input signal within each frequency band produced by said single pole filters to shape said overall frequency response.

17. The method of claim 15 further comprising separately setting the corner frequency for each single pole filter to shape said overall frequency response.

18. The method of claim 15 wherein the parametric filters are selected from a bank of available in-series symmetric minimum phase second order parametric filters.

19. The method of claim 15 wherein the center frequency, bandwidth and gain of each of said symmetric minimum phase second order parametric filters is selected according to the characteristics of relatively narrow band resonances that exist in a particular application.

20. The method of claim 15 wherein the audio input signal is first filtered by the single pole filters for dividing the audio input signal into controllable frequency bands for shaping of the overall frequency response of the audio input signal, and then filtered by the symmetric minimum phase second order parametric filters of the parametric filter section.

21. The filtering system of claim 15 wherein the bandwidth of the each parametric filter of said parametric filtering section is no greater than about 1 octave.

* * * * *

UNITED STATES PATENT AND TRADEMARK OFFICE
CERTIFICATE OF CORRECTION

PATENT NO.          : 8,687,822 B1                                                                Page 1 of 1
APPLICATION NO.     : 11/332504
DATED               : April 1, 2014
INVENTOR(S)         : Perrin Meyer et al.

It is certified that error appears in the above-identified patent and that said Letters Patent is hereby corrected as shown below:

In the Specification
Column 3, line 34, "represented by represented by block 27" should read --represented by block 27--.
Column 3, line 66, "four the gain" should read --four gain--.
Column 5, line 19, "a octave" should read --an octave--.
Column 5, line 25, "seen the present" should read --seen that the present--.

In the Claims
Column 7, line 5, Claim 14, "of the each" should read --of each--.
Column 8, line 23, Claim 21, "of the each" should read --of each--.

Signed and Sealed this
Eleventh Day of November, 2014

Michelle K. Lee
*Deputy Director of the United States Patent and Trademark Office*